US006396750B2

(12) United States Patent
Hönigschmid et al.

(10) Patent No.: US 6,396,750 B2

(45) Date of Patent: May 28, 2002

(54) INTEGRATED MEMORY WITH REDUNDANCY AND METHOD FOR REPAIRING AN INTEGRATED MEMORY

(75) Inventors: Heinz Hönigschmid, East Fishkill, NY (US); Georg Braun, München; Andrej Majdic, Zorneding, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/888,022

(22) Filed: Jun. 22, 2001

Related U.S. Application Data

(63) Continuation of application No. PCT/DE99/03807, filed on Dec. 1, 1999.

(30) Foreign Application Priority Data

Dec. 22, 1998 (DE) ........................................ 198 59 518

(51) Int. Cl.[7] .................................................. G11C 7/00

(52) U.S. Cl. ..................... 365/200; 365/225.7; 365/201

(58) Field of Search .............................. 365/200, 225.7, 365/201

(56) References Cited

U.S. PATENT DOCUMENTS 5,438,546 A * 8/1995 Ishac et al. ............ 365/189.02
5,497,347 A * 3/1996 Feng ..................... 365/189.02
5,568,432 A 10/1996 Wada
5,572,471 A * 11/1996 Proebsting .................. 365/200
5,732,030 A * 3/1998 Dorney ........................ 365/200
5,761,138 A 6/1998 Lee et al.
6,104,649 A * 8/2000 Toda .......................... 365/200

FOREIGN PATENT DOCUMENTS

| | | |
|---|---|---|
| DE | 42 41 327 C2 | 6/1993 |
| JP | 01066762 | 3/1989 |
| JP | 07272499 | 3/1994 |
| WO | WO00/38066 | 6/2000 |

* cited by examiner

*Primary Examiner*—Huan Hoang

(74) *Attorney, Agent, or Firm*—Laurence A. Greenberg; Werner H. Stemer; Ralph E. Locher

(57) ABSTRACT

An integrated memory has a normal bit line for transferring data from or to normal memory cells connected to it, and also a normal sense amplifier, which is connected via a line to the normal bit line and connected to a data line and amplifies data read from the normal memory cells. Furthermore, the memory has a redundant sense amplifier for replacing the normal sense amplifier in the redundancy situation. The redundant sense amplifier is likewise connected on the one hand to the line and on the other hand to the data line and, in the redundancy situation, serves for amplifying the data read from the normal memory cells. A method for repairing an integrated memory is also provided.

13 Claims, 4 Drawing Sheets

INTEGRATED MEMORY WITH REDUNDANCY AND METHOD FOR REPAIRING AN INTEGRATED MEMORY

CROSS-REFERENCE TO RELATED APPLICATION

This application is a continuation of copending International Application No. PCT/DE99/03807, filed Dec. 1, 1999, which designated the United States.

BACKGROUND OF THE INVENTION

Field of the Invention

The invention relates to an integrated memory with redundancy. The invention also relates to a method for repairing an integrated memory.

It is generally known to replace defective memory cells of a memory with redundant memory cells and to repair the memory in this way. In this case, the redundant memory cells are arranged either along redundant word lines or redundant bit lines. Wada (U.S. Pat. No. 5,568,432) describes, by way of example, an integrated memory having a redundant bit line that is provided for replacing one of the normal bit lines along which the normal memory cells are arranged. The normal bit line is assigned to a sense amplifier which, when the memory cells are read, amplifies the information stored in said memory cells and supplies it to a point outside the memory. In a redundancy situation, that is to say after implementation of the replacement of the normal bit line by the redundant bit line, a redundancy shift circuit ensures that the redundant bit line, instead of the normal bit line, is connected to the sense amplifier thereof.

Wada (U.S. Pat. No. 5,568,432) additionally describes another redundancy concept in which the redundant bit line is already assigned a redundant sense amplifier that is present in addition to the normal sense amplifiers of the normal bit lines. In the redundancy situation, the redundant bit line with its redundant sense amplifier replaces the defective normal bit line and its normal sense amplifier.

SUMMARY OF THE INVENTION

It is accordingly an object of the invention to provide an integrated memory with redundancy and method for repairing an integrated memory that overcomes the hereinafore-mentioned disadvantages of the heretofore-known devices of this general type and that has bit lines that are connected to sense amplifiers, in which memory defects are repaired in a different way. With the foregoing and other objects in view, there is provided, in accordance with the invention, an integrated memory. The integrated memory includes normal memory cells. A normal bit line connects to the normal memory cells for transferring data between the normal memory cells. A normal sense amplifier is included for amplifying data read from the normal memory cells. A line connects the normal sense amplifier to the normal bit line. A data line connects to the normal sense amplifier. The integrated memory includes a redundant sense amplifier for replacing the normal sense amplifier in a redundancy situation. The redundant sense amplifier connects to the line and to the data line and amplifies data read from the normal memory cells in the redundancy situation.

With the objects of the invention in view, there is also provided a method for repairing an integrated memory. The method includes testing the normal sense amplifier and the normal bit line. If the normal sense amplifier is defective, the next step is replacing the normal sense amplifier with the redundant sense amplifier. If at least one of the normal bit line and at least one of the normal memory cells is defective, the next step is replacing the bit line with the redundant bit line. The next step is writing to and reading from the normal memory cells via the normal sense amplifier to test the normal memory cells of the normal bit line. If the normal memory cells are defective, the next step is replacing the normal bit line with the redundant bit line. The next step is writing to and reading from the redundant memory cells via the normal sense amplifier to test the redundant memory cells of the redundant bit line. If the redundant memory cells are defective, the next step is reversing the replacement of the normal bit line with the redundant bit line and replacing the normal sense amplifier with the redundant sense amplifier.

With the objects of the invention in view, there is also provided a method for repairing an integrated memory. The first step is testing the normal sense amplifier and the normal bit line with the normal memory cells connected thereto. If the normal sense amplifier is defective, the next step is replacing the normal sense amplifier with the redundant sense amplifier. If at least one of the normal bit line and at least one of the normal memory cells is defective, the next step is replacing the bit line with the redundant bit line. The next step is writing to and reading from the normal memory cells via the normal sense amplifier to test the normal memory cells of the normal bit line. If the normal memory cells are defective, the next step is replacing the normal sense amplifier with the redundant sense amplifier. The next step is writing to and reading from the normal memory cells via the redundant sense amplifier to test the normal memory cells of the normal bit line. If the normal memory cells remain defective, the next step is reversing the replacement of the normal sense amplifier with the redundant sense amplifier by replacing the normal bit line with the redundant bit line.

The integrated memory according to the invention has a normal bit line for transferring data from or to normal memory cells connected to it, and also a normal sense amplifier, which is connected via a line to the normal bit line and to a data line. The normal sense amplifier serves for amplifying data read from the normal memory cells. Furthermore, the integrated memory has a redundant sense amplifier for replacing the normal sense amplifier in the redundancy situation. The redundant sense amplifier is likewise connected to the line and to the data line. In the redundancy situation, the redundant sense amplifier serves for amplifying the data read from the normal memory cells.

The invention is based on the following insights. The defects that are detected during read-out via a normal bit line are for the most part attributable to defects of the bit line itself or of the normal memory cells connected to it. Nevertheless, the situation also can occur when the normal sense amplifier connected to the bit line is defective but the bit line with the memory cells connected thereto is intact. In such a situation, replacing the intact bit line with a redundant bit line would not contribute to successful repair of the memory. On the other hand, if both the defective sense amplifier and the bit line connected to it were replaced by redundant elements, even though only the normal sense amplifier is defective, a disproportionately high outlay would result compared with the solution proposed here. The invention replaces a defective normal sense amplifier with a redundant sense amplifier. The normal bit line connected to the defective sense amplifier need not be replaced by a redundant bit line at the same time. If only the normal sense amplifier is defective, but not the normal bit line, the normal bit line still can be accessed via the redundant sense amplifier in the redundancy situation.

According to a development of the invention, the integrated memory has a redundant bit line. The redundant bit line is provided for replacing the normal bit line and is likewise connected to the line. In the event of the normal bit line being replaced by the redundant bit line, data from or to redundant memory cells connected to the redundant bit line is transferred either via the normal or the redundant sense amplifier. This depends on whether the normal sense amplifier has also been replaced by the redundant sense amplifier.

This has the advantage that, independently of one another, it is possible to repair both a defect of the normal sense amplifier by using the redundant sense amplifier and a defect of the normal bit line by using the redundant bit line. This ensures a high degree of flexibility. Moreover, the existing redundant resources (redundant sense amplifier and redundant bit line) can be used the most effectively.

In addition or as an alternative to the embodiments just mentioned, the integrated memory, according to a development, has a further redundant bit line. The further redundant bit line is provided for replacing the normal bit line and is connected to the data line via a further redundant sense amplifier. In this case, the redundant sense amplifier can repair a defect of the normal sense amplifier and replacing the normal bit line and its normal sense amplifier can repair a defect of the normal bit line by the redundant further bit line and the further redundant sense amplifier.

According to a development, the integrated memory has two programmable connection elements. A first programmable connects the line to the normal sense amplifier. A second programmable connection element connects to the redundant sense amplifier. The connection elements are electrically conductive or electrically nonconductive depending on their programming state.

In addition or as an alternative to these connection elements, the integrated memory, according to a development, has two programmable connection elements. The normal sense amplifier connects via the first programmable connection element to the data line. The redundant sense amplifier connects via the second programmable connection element to the data line. These connection elements are likewise electrically conductive or electrically nonconductive depending on their programming state. By corresponding programming, the connection elements enable the normal or redundant sense amplifiers to be electrically decoupled from the line or from the data line depending on whether or not the redundancy situation is present. As a result, malfunctions are avoided and the capacitive loading for the respectively activated sense amplifier is minimized.

Reversibly-programmable programmable connection elements are particularly advantageous because their programming can be reversed again or cancelled. In the context of the repair method, reversibly-programmable programmable conection elements enable a trial replacement either of the normal sense amplifier or of the normal bit line. And, this repair can be reversed in the case where a defect is still ascertained even afterward. The defect that has now been localized can thereupon be repaired using the respective other type of redundancy which has not hitherto been employed.

Other features that are considered as characteristic for the invention are set forth in the appended claims.

Although the invention is illustrated and described herein as embodied in an integrated memory with redundancy, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
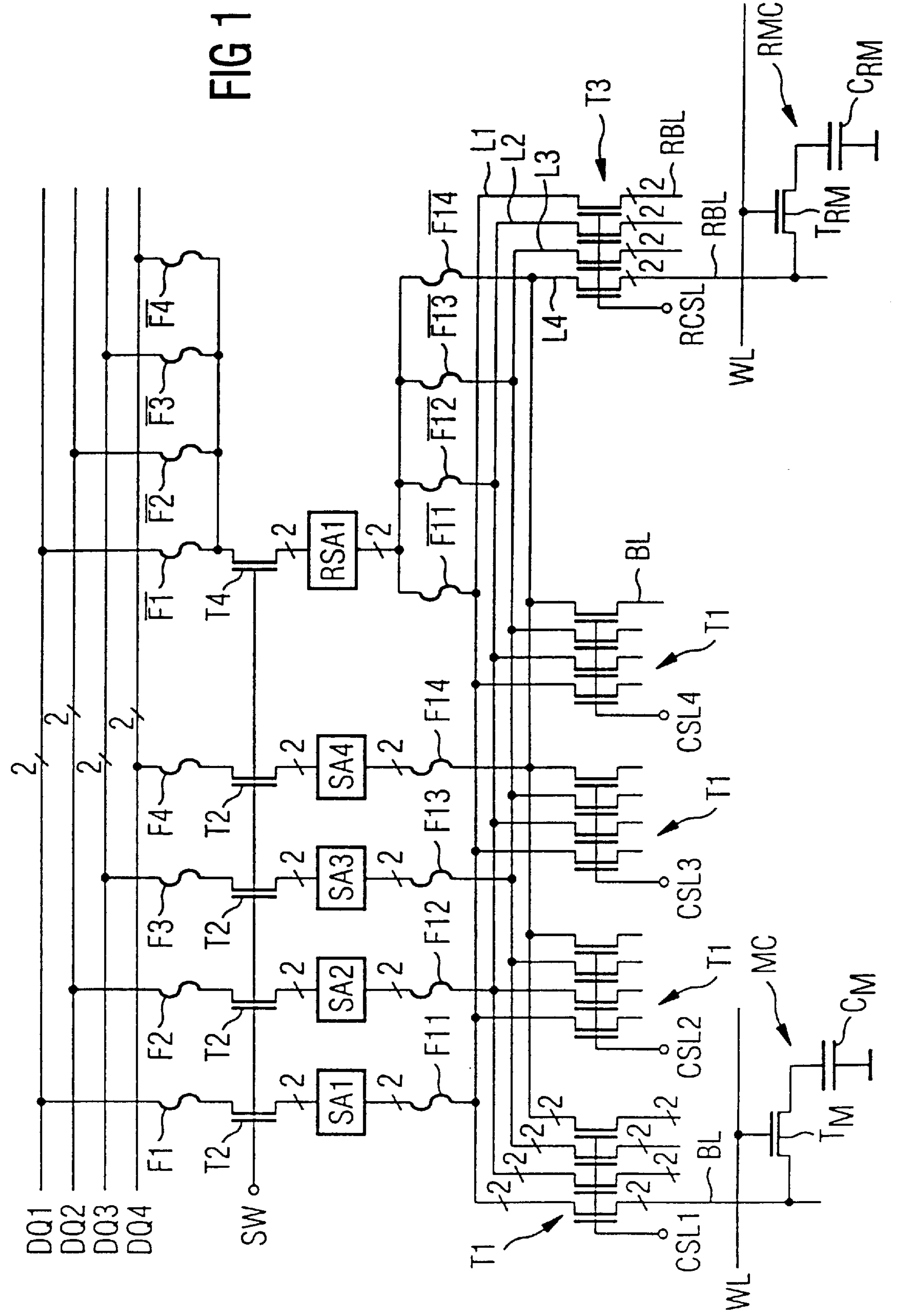
FIG. 1 is a partial schematic and partial block view showing a first embodiment of an integrated memory.

In all the figures of the drawing, sub-features and integral parts that correspond to one another bear the same reference symbol in each case.

Referring now to the figures of the drawings in detail and first, particularly to FIG. 1 thereof, there is shown an exemplary embodiment of the integrated memory according to the invention. The integrated memory is a DRAM, although the invention also can be applied to other memories which have sense amplifiers connected to bit lines, such as, for example, FRAMs or FeRAMs (ferroelectric memories). The memory has four normal sense amplifiers SAi and a redundant sense amplifier RSA1. The reference letter "i" is shorthand standing for integer; so, when a part is labeled SAi, for example, it is short hand for SA1, SA2, SA3, etc. The normal sense amplifiers SAi are connected to a respective line pair Li via in each case two first programmable connection elements in the form of laser fuses F11 to F14. The DRAM has memory cells MC of the one-transistor/one-capacitor type with a selection transistor $T_M$ and a storage capacitor $C_M$. The gate of the selection transistor $T_M$ is connected to a word line WL. The storage capacitor is connected to ground by one of its electrodes and, by its other electrodes, is connected to a bit line BL via the controllable path of the selection transistor $T_M$. In practice, the memory has a large number of word lines WL and memory cells MC, of which, however, only one in each case has been indicated by way of example in FIG. 1. The memory cells are arranged in a matrix-like manner at crossover points of the word lines and bit lines. FIG. 1 shows four groups each of four bit line pairs BL. Each bit line pair BL from each of these groups is connected to one of the line pairs Li via first transistors T1 of the n-channel type. The gates of the first transistors T1 of each group are driven in each case via a common column select signal CSLi. Only one of the column select signals CSLi is active at the same point in time, so that only the bit line pairs BL of one of the groups are connected to the four line pairs Li.

Furthermore, the four normal sense amplifiers SAi are connected to a respective data line pair DQi via second transistors T2 of the n-channel type and second programmable connection elements in the form of fuses F1 to F4.

The sense amplifiers SAi, RSA1 are differential sense amplifiers. The invention can also be applied to memories whose sense amplifiers do not operate differentially, but rather are in each case connected only to one bit line instead of to a bit line pair.

Furthermore, the memory in FIG. 1 has a redundant sense amplifier RSA1. The redundant sense amplifier is connected to a respective one of the line pairs Li via pairs of third programmable connection elements in the form of laser fuses $\overline{F11}$ to $\overline{F14}$. Furthermore, the redundant sense amplifier is also connected to a respective one of the data line pairs DQi via pairs of fourth programmable connection elements in the form of laser fuses $\overline{F1}$ to $\overline{F4}$ and also a pair of fourth transistors T4 connected upstream of the latter.

The integrated memory in FIG. 1 furthermore has redundant bit line pairs RBL. The four redundant bit line pairs RBL are connected to a multiplicity of redundant memory cells RMC, of which one has been illustrated by way of example in FIG. 1. It is connected to one of the redundant bit lines of one of the redundant bit line pairs. The redundant memory cells RMC are constructed just like the normal memory cells MC and have a selection transistor $T_{RM}$ and a storage capacitor $C_{RM}$. The selection transistor $T_{RM}$ of the redundant memory cells RMC is connected to one of the word lines WL by its gate. Each redundant bit line pair RBL is connected to one of the line pairs Li via corresponding third transistors T3. Gates of the third transistors T3 are connected to a redundant column select signal RCSL.

If the memory shown in FIG. 1 does not have a defect, the first connection elements F11 to F14 and the second connection elements F1 to F4 are not interrupted, while the third connection elements $\overline{F11}$ to $\overline{F14}$ and the fourth connection elements $\overline{F1}$ to $\overline{F4}$ are interrupted. Consequently, the redundant sense amplifier RSA1 is completely decoupled from the line pairs Li and the data line pairs DQi and no longer influences the operation of the memory. However, if it is ascertained that one of the normal sense amplifiers SAi is defective, for example the normal sense amplifier SA1 on the far left in FIG. 1, the first connection element F11 connected to it and the second connection element F1 connected to it are interrupted. In the case of the redundant sense amplifier SA1, the connection elements $\overline{F2}$ to $\overline{F4}$ and also $\overline{F12}$ to $\overline{F14}$ are interrupted but the connection elements $\overline{F1}$ and $\overline{F11}$ are not interrupted. Because the gates of the second transistors T2 and of the fourth transistor T4 are driven by a common select signal SW, the redundant sense amplifier RSA1 can completely replace the normal sense amplifier SA1 in this way. If one of the other normal sense amplifiers SA2 to SA4 is defective but the first normal sense amplifier SA is intact, the electrical connection elements are interrupted in a corresponding manner in order to carry out a repair.

The redundant bit line pairs RBL in the memory in FIG. 1 allow a defect on one or more of the bit line pairs BL of one of the four groups to be repaired. For this purpose, activation of the group having the defect via its column select signal CSLi is prevented, and instead the redundant bit line group is activated by its redundant column select signal RCSL. The memory shown in FIG. 1 thus affords the possibility of repairing defects of one of its sense amplifiers SAi and defects within one of its bit line groups independently of one another with the aid of the redundant sense amplifier RSA1 and the redundant bit lines RBL.

Figure 5:
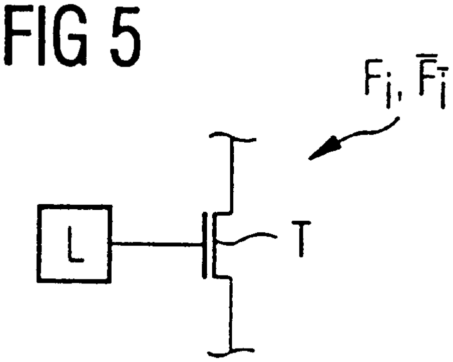
FIG. 5 is a partial schematic and partial block drawing showing a programmable connection element.

It is advantageous if the programmable connection elements F1 to $\overline{F14}$, depicted in FIG. 1, are reversibly programmable elements. In that case, for example, in a basic state of the integrated memory after it has been fabricated, firstly, the connection elements F1 to F14 may be conductive and the connection elements $\overline{F1}$ to $\overline{F14}$ nonconductive and corresponding reprogramming may be effected as a function of defects ascertained in the context of a memory test. FIG. 5 shows such a reversibly programmable connection element Fi; $\overline{Fi}$. It has an n-channel transistor T whose controllable channel path is to be arranged in the exemplary embodiment from FIG. 1 instead of the laser fuses depicted there. Its gate is connected to the output of a programmable register L, in which optionally high or a low potential can be stored. If a high potential is stored in the register L, the programmable connection element Fi is electrically conductive. It is electrically nonconductive in the opposite case.

Figure 4:
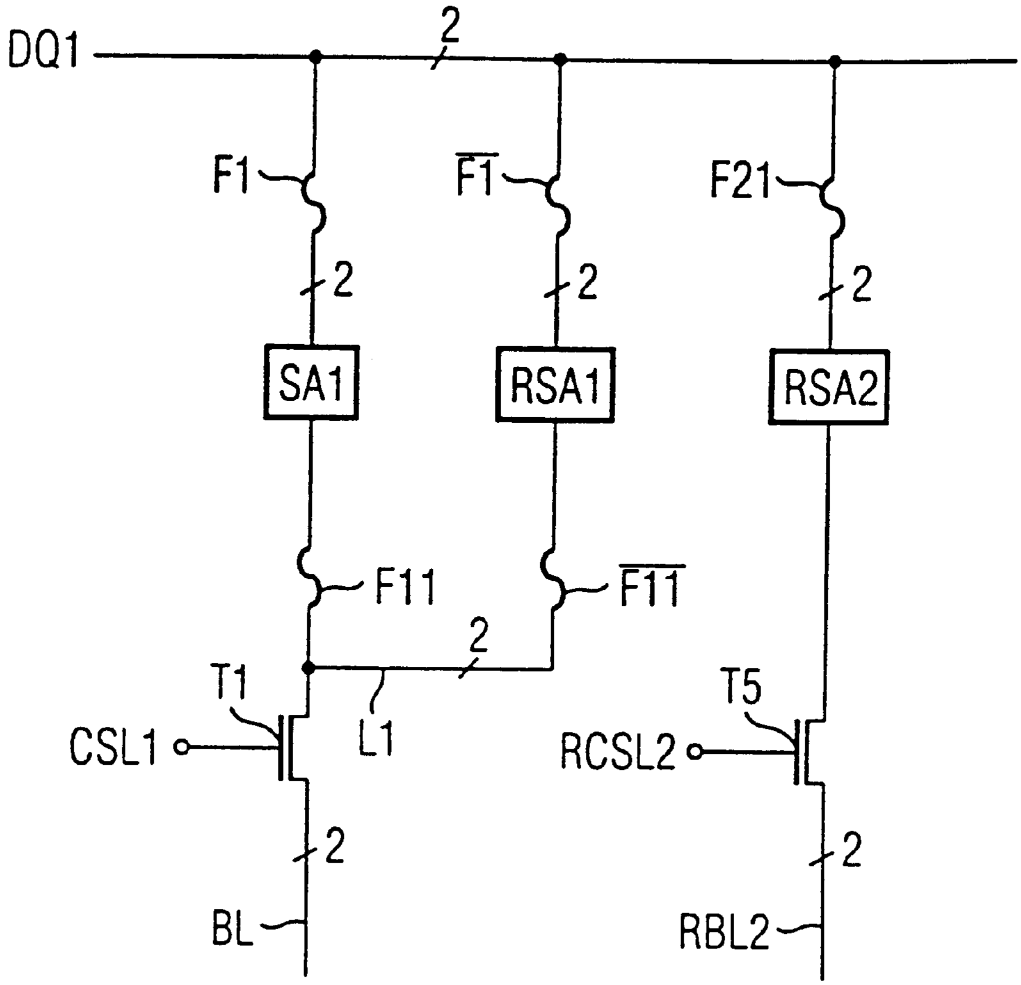
FIG. 4 is a partial schematic and partial block drawing showing a second exemplary embodiment of the integrated memory.

FIG. 4 shows another exemplary embodiment of the integrated memory, in which a normal bit line pair BL is again connected to a line pair L1 via first transistors T1. A column select signal CSL1 is again fed to the gate of the first transistor T1. The line pair L1 is connected via programmable connection elements F11, $\overline{F11}$ on the one hand to a normal sense amplifier SA1 and on the other hand to a redundant sense amplifier RSA1. The normal sense amplifier SA1 is connected via a pair of programmable connection elements F1 to a data line pair DQ1. The redundant sense amplifier RSA1 is connected via a pair of programmable connection elements $\overline{F1}$ to the data line pair DQ1. Furthermore, the memory in FIG. 4 has a redundant bit line pair RBL2, which is connected via two fifth transistors T5 to a further redundant sense amplifier RSA2. The gates of the fifth transistors T5 are connected to a redundant column select signal RCSL2. The further redundant sense amplifier RSA2 is connected via a pair of programmable connection elements F21 to the data line pair DQ1. The programmable connection elements F1, $\overline{F1}$, F11, $\overline{F11}$, F21 depicted in FIG. 4 may, for example, once again be laser fuses. Advantageously, however, they are reversibly programmable connection elements of the type already explained with reference to FIG. 5.

In the case of the memory shown in FIG. 4, it is possible, in the case of a defect of the normal sense amplifier SA1, to replace the latter by the redundant sense amplifier RSA1 connected in parallel with it. If no such replacement is to be performed, it is expedient for the connection elements $\overline{F1}$ and $\overline{F11}$ to be switched to be nonconductive or to be interrupted. On the other hand, if the redundant sense amplifier RSA1 is to be used instead of the normal sense amplifier SA1, the connection elements F1 and F11 are switched to be nonconductive. If the redundant bit line pair RBL2 does not serve for replacing the normal bit line pair BL, the connection element F21 is also switched to be nonconductive. On the other hand, if a defect of the normal bit line pair BL or of normal memory cells connected to the latter is involved, the normal sense amplifier SA1 is not replaced by the redundant sense amplifier RSA1, rather the normal sense amplifier SA1 and the normal bit line pair BL are jointly replaced by the further redundant sense amplifier RSA1 and the redundant bit line pair RBL2. The activation of the column select signal CSL1 is then suppressed and the redundant column select signal RCSL2 is instead activated at the same point in time. In this case, the connection element F21 is switched to be permanently conductive and the connection elements F1, $\overline{F1}$, F11 and $\overline{F11}$ are switched to be nonconductive.

The exemplary embodiments outlined have the advantage that a defect of one of the normal sense amplifiers SAi can be repaired by the redundant sense amplifier RSA1 without redundant bit lines RBL2 having to be used. The use of the normal bit lines BL is further possible by the use of the redundant sense amplifier RSA1. Therefore, the redundant bit lines RBL2 can be used for repairing defective normal bit lines BL which are connected to another normal sense amplifier SAi (not illustrated in FIG. 4). It should be noted that FIG. 4, in particular, shows only a small detail from a real memory, which in reality has a much larger number of normal sense amplifiers SAi. Thus, FIG. 4 should not be understood such that each normal bit line pair BL and the normal sense amplifier SA1 connected thereto are assigned both a separate redundant sense amplifier RSA1 without redundant bit line and a further separate redundant sense amplifier RSA2 with redundant bit lines RBL2. Rather, the redundant sense amplifier RSA1 is in practice assigned to a plurality of normal sense amplifiers SAi, as can be gathered for example from FIG. 1. Equally, the further redundant sense amplifier RSA2 may preferably be assigned to a multiplicity of normal sense amplifiers SAi with the associated normal bit line pairs BL, of which it can replace one in each case.

In the case of the previously described memories, a memory can be tested by writing to the memory cells MC via the data line pairs DQi and the normal sense amplifiers SAi, the line pairs Li, and also the normal bit line pairs BL. Subsequently, these components are read out again from the memory cells in the opposite direction. If defects are ascertained in the process and the defect concerns one of the normal sense amplifiers SAi or one of the normal bit line pairs BL, depending on this test result, the relevant normal sense amplifier SAi can be replaced by the redundant sense amplifier RSA1 or for the relevant defective normal bit line pair BL or the entire bit line group of in each case four bit line pairs BL to be replaced by the corresponding redundant bit lines RBL.

Figure 2:
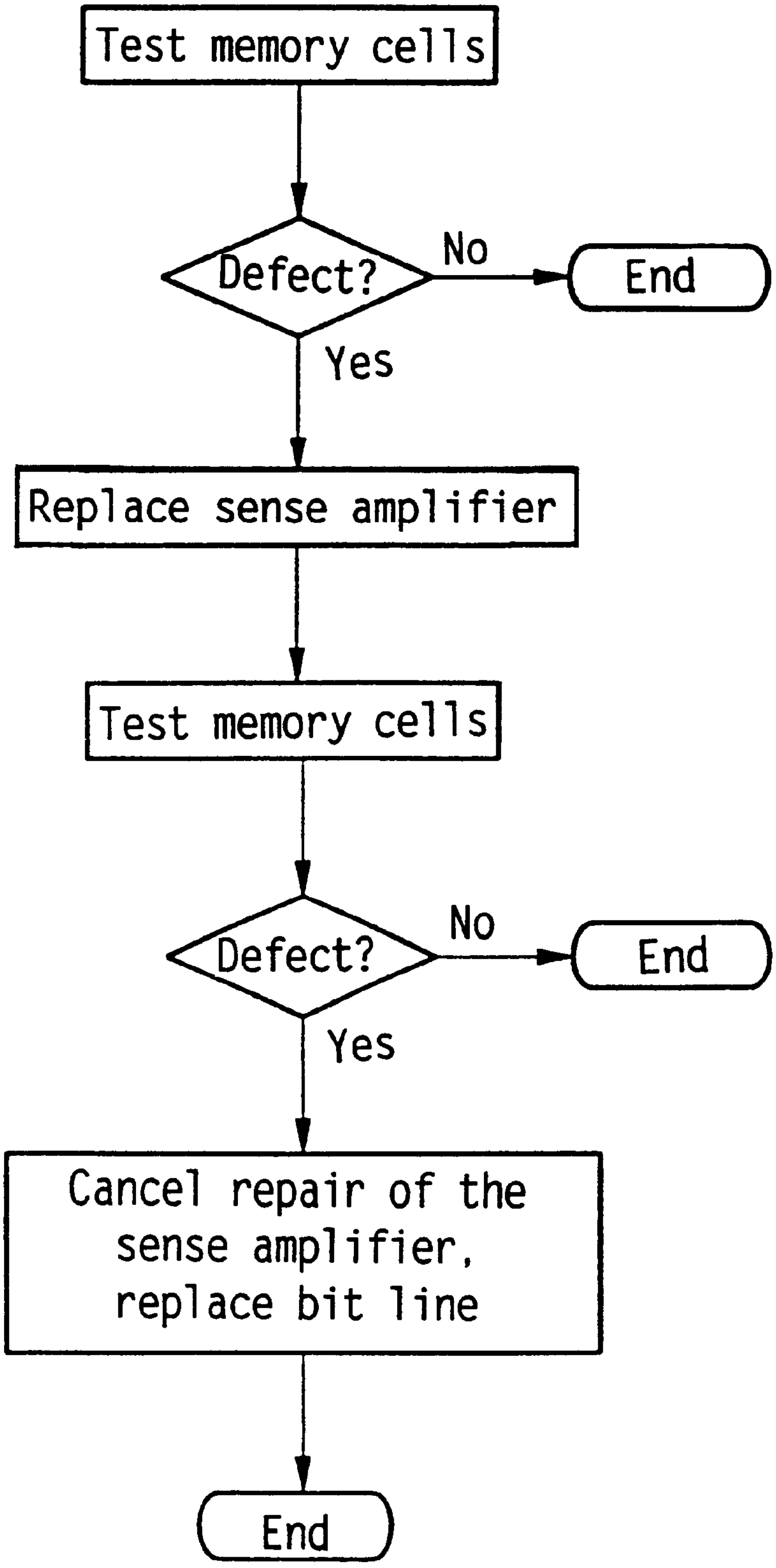
FIG. 2 is a flow chart of a first embodiment of the repair method.

FIG. 2 illustrates an exemplary embodiment of a repair method for the integrated memory from FIG. 1, which has reversibly programmable connection elements F1 to $\overline{F14}$ in accordance with FIG. 5. Firstly, the memory cells MC are tested by writing and reading data via the normal sense amplifiers SAi. If no defect is ascertained in the process, the test is ended and the memory is declared to be intact. By contrast, if a defect is ascertained, and it is unclear whether said defect is based on a defect of the relevant normal sense amplifier SAi or one of the bit lines BL or the memory cells MC connected to this, the relevant normal sense amplifier SAi is replaced by the redundant sense amplifier RSA1. Afterward, the testing of those memory cells in which a defect was previously ascertained is repeated. If the defect could thereby be remedied, the defect was actually on the replaced normal sense amplifier SAi and the repair method can be ended. However, if the defect is still present, the repair of the normal sense amplifier SAi by the redundant sense amplifier RSA1 is cancelled or reversed and the normal bit lines BL connected to this normal sense amplifier SAi are replaced by the redundant bit lines RBL. The repair method is then ended, because the defect was obviously not on the normal sense amplifier SAi but on one of its bit lines BL.

Figure 3:
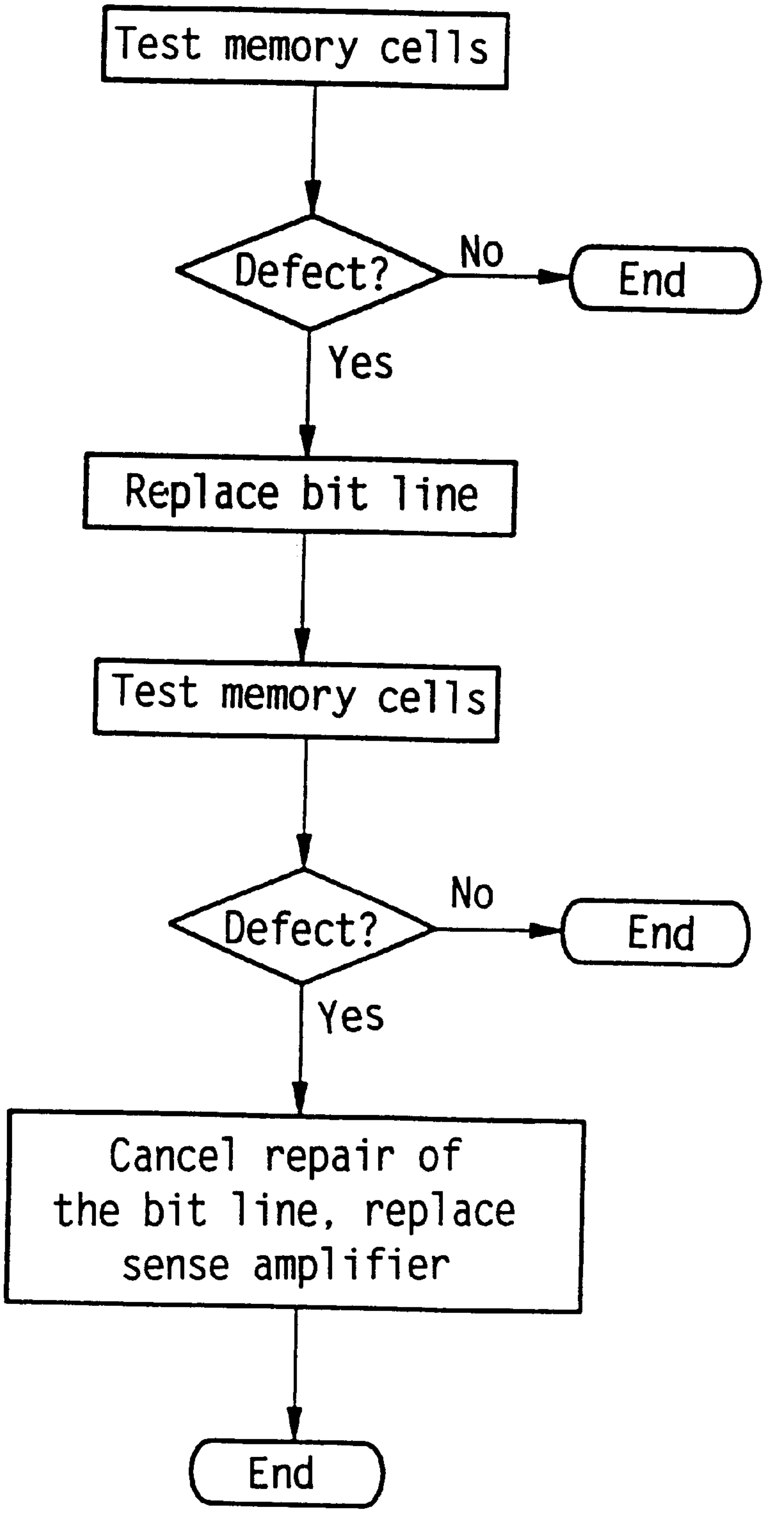
FIG. 3 is a flow chart of a second embodiment of the repair method.

FIG. 3 shows another repair method for the memory from FIG. 1. Once again, writing and reading data in the manner described above tests the memory cells. If a defect is ascertained in the process, and it is unclear whether one of the normal sense amplifiers SAi or the normal bit lines BL connected to this are defective, in this method firstly the corresponding normal bit lines BL are replaced by the redundant bit lines RBL.

Afterward, those memory cells in which a defect was previously ascertained when they were tested are tested anew. If no defect is ascertained in the process, the repair was obviously successful and the defect was actually on one of the replaced normal bit lines. However, if a defect is still ascertained, the repair of the bit lines is cancelled and the redundant sense amplifier RSA1 instead replaces the corresponding normal sense amplifier SAi. The defect ascertained can obviously only have been caused by the replaced normal sense amplifier SAi. This repair method is thus concluded.

In the repair methods in accordance with FIGS. 2 and 3, the programmable connection elements F1, . . . , $\overline{F14}$ are programmed in a manner dependent on the repair carried out in each case. In order to enable the repair to be cancelled, the connection elements are preferably reversibly programmable, for example of the type illustrated in FIG. 5. Their programming is repeatedly changed, under certain circumstances, while the chosen repair method is being carried out.

We claim:

1. An integrated memory, comprising:

normal memory cells;

a normal bit line connected to said normal memory cells for transferring data between said normal memory cells;

a normal sense amplifier for amplifying data read from said normal memory cells;

a line connecting said normal sense amplifier to said normal bit line;

a data line connected to said normal sense amplifier; and a redundant sense amplifier for replacing said normal sense amplifier in a redundancy situation, said redundant sense amplifier connected to said line and to said data line and amplifying data read from said normal memory cells in the redundancy situation.

2. The integrated memory according to claim 1, including:

redundant memory cells; and a redundant bit line connecting said redundant memory cells for replacing said normal bit line connected to said line;

one of said normal sense amplifier and said redundant sense amplifier transferring data from said redundant memory cells when said normal bit line is replaced by said redundant bit line.

3. The integrated memory according to claim 1, including:

a further redundant sense amplifier; and a further redundant bit line for replacing said normal bit line, said further redundant bit line connected to said data line via said further redundant sense amplifier.

4. The integrated memory according to claim 1, including:

a programmable connection element connecting said line to said normal sense amplifier; and a further programmable connection element connecting said line to said redundant sense amplifier;

said programmable connection elements having an electrical conductivity determined by their programming state.

5. The integrated memory according to claim 4, wherein said programmable connection elements are conductive.

6. The integrated memory according to claim 4, wherein said programmable connection elements are nonconductive.

7. The integrated memory according to claim 4, wherein said programmable connection elements are reversibly programmable.

8. The integrated memory according to claim 1, including:

a programmable connection element connecting said normal sense amplifier to said data line; and a further programmable connection element connecting said redundant sense amplifier to said data line;

said connection elements having an electrical conductivity depending on their programming state.

9. The integrated memory according to claim 8, wherein said connection elements are conductive.

10. The integrated memory according to claim 8, wherein said connection elements are nonconductive.

11. The integrated memory according to claim 8, wherein said programmable connection elements are reversibly programmable.

12. A method for repairing an integrated memory having normal memory cells, which comprises:

providing a normal bit line connected to the normal memory cells for transferring data between the normal memory cells;

providing a normal sense amplifier for amplifying data read from the normal memory cells;

providing a line connecting the normal sense amplifier to the normal bit line;

providing a data line connected to the normal sense amplifier;

providing a redundant sense amplifier for replacing the normal sense amplifier in a redundancy situation, the redundant sense amplifier connected to the line and to the data line and amplifying data read from the normal memory cells in the redundancy situation;

testing the normal sense amplifier and the normal bit line;

if the normal sense amplifier is defective, replacing the normal sense amplifier with the redundant sense amplifier;

if at least one of the normal bit line and at least one of the normal memory cells is defective, replacing the bit line with the redundant bit line;

writing to and reading from the normal memory cells via the normal sense amplifier to test the normal memory cells of the normal bit line;

if the normal memory cells are defective, replacing the normal bit line with the redundant bit line;

writing to and reading from the redundant memory cells via the normal sense amplifier to test the redundant memory cells of the redundant bit line; and if the redundant memory cells are defective, reversing the replacement of the normal bit line with the redundant bit line and replacing the normal sense amplifier with the redundant sense amplifier.

13. A method for repairing an integrated memory having normal memory cells, which comprises:

providing a normal bit line connected to the normal memory cells for transferring data between the normal memory cells;

providing a normal sense amplifier for amplifying data read from the normal memory cells;

providing a line connecting the normal sense amplifier to the normal bit line;

providing a data line connected to the normal sense amplifier;

providing a redundant sense amplifier for replacing the normal sense amplifier in a redundancy situation, the redundant sense amplifier connected to the line and to the data line and amplifying data read from the normal memory cells in the redundancy situation;

testing the normal sense amplifier and the normal bit line with the normal memory cells connected thereto;

if the normal sense amplifier is defective, replacing the normal sense amplifier with the redundant sense amplifier;

if at least one of the normal bit line and at least one of the normal memory cells is defective, replacing the bit line with the redundant bit line;

writing to and reading from the normal memory cells via the normal sense amplifier to test the normal memory cells of the normal bit line;

if the normal memory cells are defective, replacing the normal sense amplifier with the redundant sense amplifier;

writing to and reading from the normal memory cells via the redundant sense amplifier to test the normal memory cells of the normal bit line; and if the normal memory cells remain defective, reversing the replacement of the normal sense amplifier with the redundant sense amplifier by replacing the normal bit line with the redundant bit line.

* * * * *